United States Patent
Nishioka et al.

(10) Patent No.: US 9,341,685 B2
(45) Date of Patent: May 17, 2016

(54) ANTIFERROMAGNETIC (AFM) GRAIN GROWTH CONTROLLED RANDOM TELEGRAPH NOISE (RTN) SUPPRESSED MAGNETIC HEAD

(71) Applicant: HGST Netherlands B.V., Amsterdam (NL)

(72) Inventors: Kouichi Nishioka, Hiratsuka (JP); Koujiro Komagaki, Odawara (JP)

(73) Assignee: HGST Netherlands B.V., Amsterdam (NL)

( * ) Notice: Subject to any disclaimer, the term of this patent is extended or adjusted under 35 U.S.C. 154(b) by 4 days.

(21) Appl. No.: 13/893,252

(22) Filed: May 13, 2013

(65) Prior Publication Data

US 2014/0334032 A1 Nov. 13, 2014

(51) Int. Cl.
*G11B 5/127* (2006.01)
*G01R 33/09* (2006.01)
*G11B 5/73* (2006.01)
*G11B 5/39* (2006.01)

(52) U.S. Cl.
CPC .............. *G01R 33/093* (2013.01); *G11B 5/127* (2013.01); *G11B 5/3906* (2013.01); *G11B 5/3929* (2013.01); *G11B 5/732* (2013.01); *Y10T 428/115* (2015.01)

(58) Field of Classification Search
CPC ...... G11B 5/127; G11B 5/1276; G11B 5/147; G11B 5/3906; G11B 5/3929; G11B 5/732; G01R 33/093; Y10T 428/115
USPC .................. 360/110, 75, 313, 324.1, 324.11, 360/324.12, 123.45; 428/810, 811.2, 812; 427/127
See application file for complete search history.

(56) References Cited

U.S. PATENT DOCUMENTS

| | | | |
|---|---|---|---|
| 6,222,707 B1 | 4/2001 | Huai et al. | |
| 6,683,815 B1 * | 1/2004 | Chen ...................... | G11C 11/16 365/158 |
| 6,960,480 B1 * | 11/2005 | Horng ................... | B82Y 25/00 257/E43.004 |
| 7,256,971 B2 * | 8/2007 | Horng ................... | B82Y 25/00 204/192.2 |
| 7,476,954 B2 | 1/2009 | Wang et al. | |
| 7,564,658 B2 | 7/2009 | Zhang et al. | |
| 7,646,568 B2 | 1/2010 | Zhang et al. | |

(Continued)

OTHER PUBLICATIONS

Imakita et al. "Giant exchange anisotropy observed in Mn—Ir/Co—Fe bilayers containing ordered Mn3Ir phase," Applied Physics Letters, vol. 85, No. 17, Oct. 25, 2004, pp. 3812-3814.

(Continued)

*Primary Examiner* — Thomas Alunkal
(74) *Attorney, Agent, or Firm* — Zilka-Kotab, PC

(57) ABSTRACT

In one embodiment, a magnetic read head includes an antiferromagnetic (AFM) layer including a MnIr alloy having an $L_{12}$ ordered phase, a pinned layer positioned above the AFM layer, and a seed layer positioned directly below the AFM layer, wherein the seed layer includes a laminated structure with an upper layer including Ru being positioned above one or more additional layers. In another embodiment, a magnetic read head includes an AFM layer including a MnIr alloy having an $L_{12}$ ordered phase, a pinned layer positioned above the AFM layer, and a seed layer positioned directly below the AFM layer, the seed layer including a laminated structure of Ta/Y/Ru, wherein Y is a layer having an element or an alloy. Other magnetic heads having a reduced amount of random telegraph noise (RTN) and methods of formation thereof are disclosed according to more embodiments.

20 Claims, 10 Drawing Sheets

(56) References Cited

U.S. PATENT DOCUMENTS

| | | | | |
|---|---|---|---|---|
| 7,738,220 B1* | 6/2010 | Fukuzawa | ............... | B82Y 10/00 360/324.12 |
| 7,796,364 B2 | 9/2010 | Lin | | |
| 7,924,607 B2* | 4/2011 | Yoshikawa | ............. | G11C 11/16 365/148 |
| 8,164,862 B2 | 4/2012 | Zhang et al. | | |
| 8,189,302 B2* | 5/2012 | Gurney | ................ | G01R 33/095 360/313 |
| 8,611,053 B2* | 12/2013 | Brinkman | ............ | G11B 5/3906 360/324.11 |
| 2005/0157544 A1* | 7/2005 | Min | ....................... | B82Y 25/00 365/171 |
| 2005/0264957 A1* | 12/2005 | Li | ............................ | G11B 5/39 360/324.12 |
| 2007/0146928 A1* | 6/2007 | Zhang | ................... | B82Y 25/00 360/123.24 |
| 2007/0211392 A1 | 9/2007 | Zeltser | | |
| 2008/0118781 A1* | 5/2008 | Takahashi | ............ | G11B 5/1278 428/828.1 |
| 2008/0137236 A1* | 6/2008 | Lee | ........................ | B82Y 25/00 360/324.11 |
| 2009/0080122 A1* | 3/2009 | Freitag | ................... | B82Y 10/00 360/324.1 |
| 2009/0168270 A1* | 7/2009 | Takahashi | .............. | B82Y 25/00 360/324.11 |
| 2009/0195924 A1* | 8/2009 | Nemoto | ............... | G11B 5/7325 360/110 |
| 2010/0173174 A1* | 7/2010 | Imakita | .................. | B82Y 10/00 428/800 |
| 2011/0235214 A1 | 9/2011 | Leung et al. | | |
| 2012/0069472 A1* | 3/2012 | Lin | ..................... | G01R 33/098 360/123.37 |
| 2013/0094108 A1* | 4/2013 | Gao | .................... | G01R 33/093 360/234.3 |

OTHER PUBLICATIONS

Dai et al., "Structural and Magnetic Properties of NiFe/NiMn Bilayers with Different Seed and Cap Layers," Journal of Magnetism and Magnetic Material, vol. 257, 2003, pp. 190-194.

* cited by examiner

ANTIFERROMAGNETIC (AFM) GRAIN GROWTH CONTROLLED RANDOM TELEGRAPH NOISE (RTN) SUPPRESSED MAGNETIC HEAD

FIELD OF THE INVENTION

The present invention relates to magnetic data storage and retrieval, and more specifically, this invention relates to a magnetic head having a reduced amount of random telegraph noise (RTN) and systems thereof.

BACKGROUND

In order to produce high recording densities in hard disk drives (HDDs), recording bit length and recording track width of a recording medium may be reduced, in one approach. In order to read data from the recording medium having the recording bits with the reduced track width, without substantial amounts of error, a track width of a read head sensor (referred to as "read head track width") and a stripe height (a depth from an air bearing surface of the read head) may also be reduced. The track width and the stripe height of the read head may be approximately 15 nm at a recording density of 2 terabytes per square inch (Tbpsi) and approximately 5 nm at a recording density of 5 Tbpsi.

The miniaturization of the read head sensor leads to a smaller volume of the magnetic body from which the read sensor is constructed. As a result, read noise is very undesirably large due to the increased magnetic instability caused by the anti-magnetic field of the magnetic body. In addition, miniaturization of the sensor reduces sensor sensitivity. Therefore, problems relating to degradation of the signal-to-noise ratio (SNR) and a significant increase in the error rate are also observable. The magnetic bodies forming the read sensor film may comprise an antiferromagnetic layer, a pinned layer, and a free layer. Improvements in the magnetic stability of these magnetic bodies would be very beneficial to magnetic head manufacturing and usage.

The sensor changes resistance by using a tunneling effect of electrons in an insulated barrier layer, which is referred to as tunneling magnetic resistance (TMR). The sensor film may comprise a seed layer, an antiferromagnetic (AFM) layer on the seed layer, a pinned layer formed on the AFM layer, an insulated barrier layer formed on the pinned layer, a free layer formed on the insulated barrier layer, and a cap layer formed on the free layer. The pinned layer has fixed magnetization by virtue of a strong exchange coupling field from the AFM layer, and there should be no fluctuation in magnetization during the signal reading process. The free layer should readily change the direction of magnetization according to a signal magnetic field from a recording medium comprising a special soft magnetic material.

During the process of reading a HDD, the magnetization of these magnetic layers may greatly fluctuate due to disturbances other than the signal magnetic field. Such great fluctuation in magnetization is undesirable, as it may be superimposed on the read signal as a read noise signal or cause errors in the reading process.

A magnetic moment of the pinned layer is pinned by an exchange coupling force from the AFM layer. Conventionally, a MnIr disordered alloy film may be used. The MnIr alloy film may have a face-centered-cubic (fcc) crystal structure with atoms arranged randomly in the structure. The miniaturization of the stripe height accompanying the miniaturization of the read head increases the demagnetizing field of the pinned layer, and the pinned layer becomes unstable, leading to fluctuations in magnetization sue to the disturbances. Therefore, sensor miniaturization and a stronger exchange coupling force are beneficial.

A large increase in the exchange coupling force between the AFM layer and the ferromagnetic layer of a $L_{12}$ ordered alloy of $Mn_3Ir$ has been shown. K. Imakita et al., "Giant exchange anisotropy observed in Mn—Ir/Co—Fe bilayers containing ordered $Mn_3Ir$ phase," Appl. Phys. Lett., 85, 3812 (2004). $L_{12}$ ordered $Mn_3Ir$ is an alloy of Mn and Ir with an ordered placement of atoms that has a structure that places Mn in the center positions of the faces in a fcc lattice and places Ir in the corner positions. When a sputtering device is used to deposit film of MnIr at room temperature, a MnIr disordered alloy film is obtained. When growing an $L_{12}$ ordered alloy of $Mn_3Ir$, it has been reported that substrate heating, high gas pressure film deposition, and cold film deposition after MnIr deposition processes are required.

A film deposition chamber capable of high-temperature film deposition and a cooling chamber capable of cooling the substrate during the film deposition process, therefore, may be used to deposit the ordered film of $Mn_3Ir$. The fabrication of an ordered alloy by hot film deposition has been attempted, and the fabrication of a $L_{12}$ ordered alloy of $Mn_3Ir$ was confirmed. The results of X-ray diffraction measurements confirmed a degree of order representing the extent of the ordering ranges from 0.15 to 0.30, and a substantial increase in the value of the exchange coupling constant, Jk, that represents the strength of the exchange coupling force between the anti-ferromagnetic layer and the pinned layer from the conventional 0.6 erg/cm² to 1.0 erg/cm². Simultaneously, the blocking temperature, Tb, which is the temperature characteristic, substantially increased from 250° C. to 320° C.

Despite the increase in Jk over a conventional apparatus, however, the fabricated read head showed baseline fluctuation in the read signal waveform, which caused problems of read waveform instability. Fluctuation in the read signal waveform is called random telegraph noise (RTN), and is a noise produced randomly over time. RTN leads to read errors. Therefore, it would be beneficial to reduce the RTN which causes read errors.

SUMMARY

In one embodiment, a magnetic read head includes an antiferromagnetic (AFM) layer including a MnIr alloy having an $L_{12}$ ordered phase, a pinned layer positioned above the AFM layer, and a seed layer positioned directly below the AFM layer, wherein the seed layer includes a laminated structure with an upper layer including Ru being positioned above one or more additional layers.

In another embodiment, a magnetic read head includes an AFM layer including a MnIr alloy having an $L_{12}$ ordered phase, a pinned layer positioned above the AFM layer, and a seed layer positioned directly below the AFM layer, the seed layer including a laminated structure of Ta/Y/Ru, wherein Y is a layer having an element or an alloy.

According to another embodiment, a method for forming a magnetic read head includes forming a seed layer above a substrate, the seed layer including a laminated structure having an upper layer of Ru positioned above one or more additional layers, forming an AFM layer including a MnIr alloy having an $L_{12}$ ordered phase above the seed layer, and forming a pinned layer above the AFM layer.

Any of these embodiments may be implemented in a magnetic data storage system such as a disk drive system, which may include a magnetic head, a drive mechanism for passing a magnetic storage medium (e.g., hard disk) over the head, and a control unit electrically coupled to the head for controlling operation of the head.

Other aspects and advantages of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In one general embodiment, a magnetic read head includes an antiferromagnetic (AFM) layer including a MnIr alloy having an $L_{12}$ ordered phase, a pinned layer positioned above the AFM layer, and a seed layer positioned directly below the AFM layer, wherein the seed layer includes a laminated structure with an upper layer including Ru being positioned above one or more additional layers.

In another general embodiment, a magnetic read head includes an AFM layer including a MnIr alloy having an $L_{12}$ ordered phase, a pinned layer positioned above the AFM layer, and a seed layer positioned directly below the AFM layer, the seed layer including a laminated structure of Ta/Y/Ru, wherein Y is a layer having an element or an alloy.

According to another general embodiment, a method for forming a magnetic read head includes forming a seed layer above a substrate, the seed layer including a laminated structure having an upper layer of Ru positioned above one or more additional layers, forming an AFM layer including a MnIr alloy having an $L_{12}$ ordered phase above the seed layer, and forming a pinned layer above the AFM layer.

Figure 1:
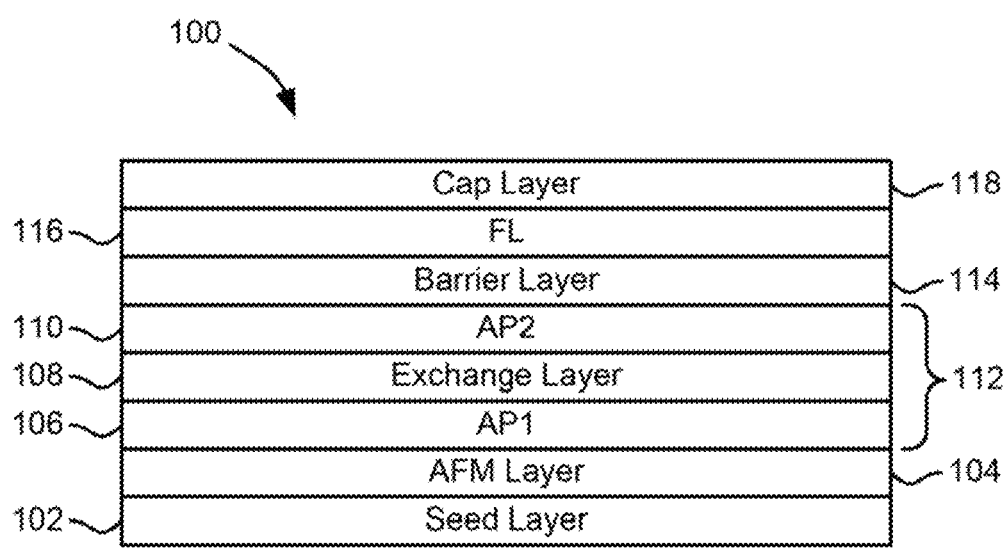
FIG. 1 is a schematic diagram of a laminated structure of a tunneling magnetoresistive (TMR) sensor.

FIG. 1 shows a tunneling magnetoresistive (TMR) sensor 100 having a laminated structure. An AFM layer 104 is formed above a seed layer 102. The AFM layer 104 may comprise MnIr may be strongly magnetically coupled by exchange coupling with the ferromagnetic layer (AP1) 106 formed thereabove. A ferromagnetic layer (AP2) 110 may be strongly antiparallel coupled to the ferromagnetic layer (AP1) 106 through a thin exchange layer 108 which may comprise Ru. AP1/exchange/AP2 is referred to as the pinned layer 112. The magnetic moment of the pinned layer 112 may be strongly pinned by the AFM layer 104. An insulated barrier layer 114, which may comprise MgO, is positioned above the ferromagnetic layer (AP2) 110, and a ferromagnetic free layer (FL) 116 is positioned above the barrier layer 114, then a cap layer 118 is positioned above the free layer 116. The free layer 116 responds to an external magnetic field. That is to say, the direction of the magnetic moment of the free layer 116 is changed by an external magnetic field.

The direction of the magnetic moment of the free layer 116 is changed by a leaking magnetic field from the medium. When the direction of the magnetic moment of the free layer 116 changes, the sensor resistance changes and is detectable as a voltage signal. This voltage signal is an indication of a bit direction of the medium, and may be interpreted in order to read magnetic information recorded on a recording medium by using a TMR sensor.

Figure 2A:
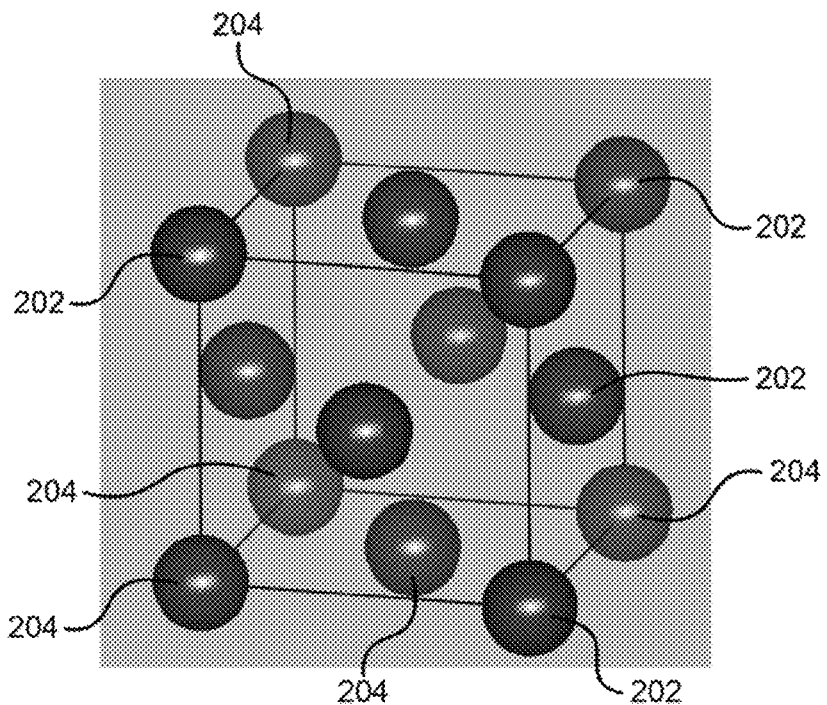
FIG. 2A shows a diagram of a face-centered cubic (fcc) crystal of MnIr.
Figure 2B:
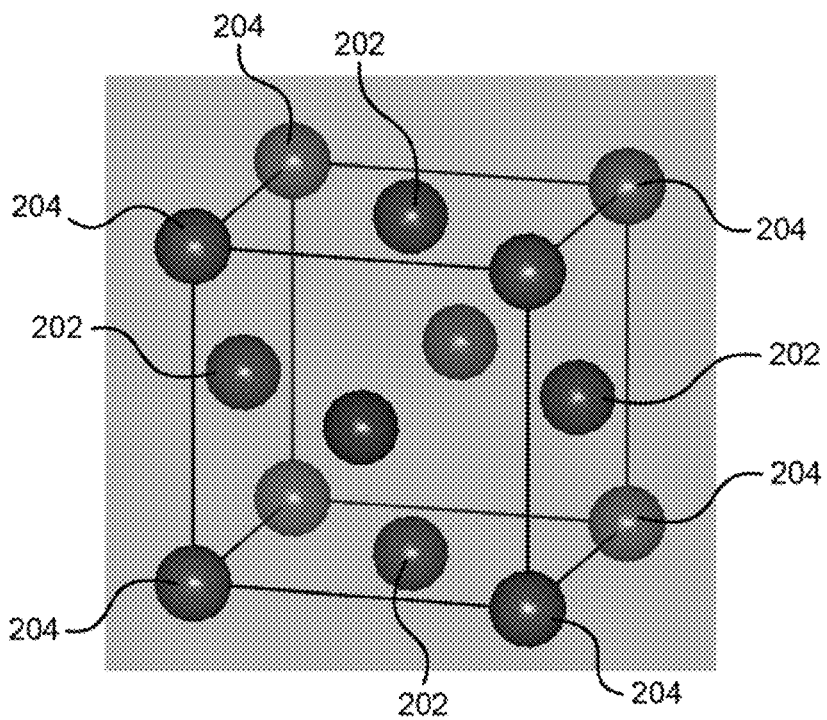
FIG. 2B shows a crystal structure of $L_{12}$ MnIr.

FIG. 2A shows the MnIr structure of a face-centered cubic (fcc) unordered phase MnIr and FIG. 2B shows the MnIr structure of a $L_{12}$ ordered phase. In the former, the Mn atoms 202 and Ir atoms 204 randomly occupy the lattice positions in a fcc lattice. As shown in FIG. 2A there is no specific ordering of the atoms, and thus they are all represented to appear the same. The particular selection of which atoms are which is for exemplary purposes only, and any random ordering could be produced. As shown in FIG. 2B, $L_{12}$ ordered phase MnIr is an alloy having an atom arrangement with a structure that places Mn atoms 202 in the center positions of the faces of the fcc lattice and places Ir atoms 204 in the corner positions.

Fabrication of an $L_{12}$ ordered alloy of $Mn_3Ir$ has been attempted in order to improve the stability of the magnetization of a pinned layer. Introducing a chamber capable of forming a film at high temperature and a cooling chamber capable of cooling a substrate during a film formation process, and fabricating an ordered alloy via hot film formation have also been attempted. In addition, production of a $L_{12}$ ordered alloy of $Mn_3Ir$ has been confirmed. X-ray diffraction has revealed that a degree of ordering of the alloy was 0.15-0.30, and the exchange coupling constant Jk which expresses the strength of an exchange-coupling force between an AFM layer and a pinned layer, had greatly increased from a conventional 0.6 erg/cm$^2$ to a more desirable 1.0 erg/cm$^2$. The blocking temperature Tb, which is a temperature characteristic, was also greatly increased from a conventional 250° C. to a more desirable 320° C.

However, despite the increase in Jk over a conventional apparatus, the read head fabricated in this manner continued to show baseline fluctuation in the read signal waveform, which caused read waveform instability. Fluctuation in the read signal waveform is called random telegraph noise (RTN), and is a noise produced randomly over time. RTN leads to read errors. Thus, suppressing RTN is a solution that may improve head performance.

According to one example, a prototype was fabricated in which a thickness of an AFM layer comprising MnIr alloy in an $L_{12}$ Mn$_3$Ir ordered alloy phase was 40 Å. For this exemplary prototype, the exchange coupling constant Jk was 0.9 erg/cm$^2$, which is greater than the 0.6 Jk of a conventional device.

Although a device with an AFM layer having a thickness of 60 Å had a Jk of 1.0 erg/cm$^2$, which is vastly different in comparison to the Jk for a 40 Å AFM layer, the blocking temperature Tb was 320° C., which is 70° C. higher than the Tb for a 40 Å AFM layer of only of 250° C. Therefore, an AFM layer having a film thickness of 60 Å was used for the prototype. Investigating the head performance of the prototype revealed that RTN was suppressed, suggesting that RTN may be caused by the AFM layer.

A detailed investigation was carried out to ascertain which characteristics of the AFM layer may have an influence on the production and propagation of RTN.

Figure 3A:
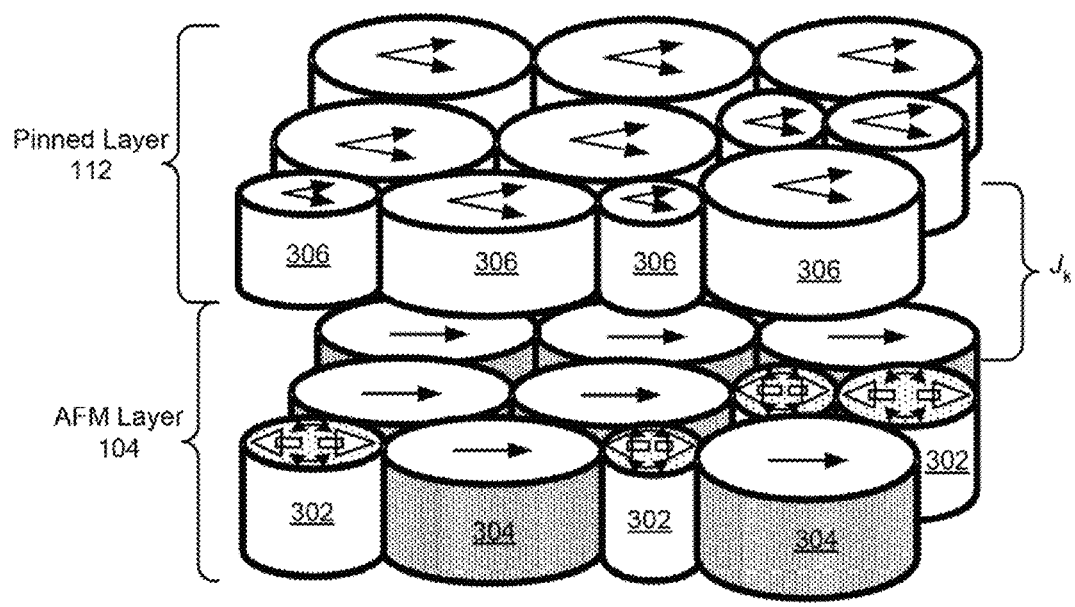
FIG. 3A shows an exemplary structure having magnetic crystals of varying sizes.
Figure 3B:
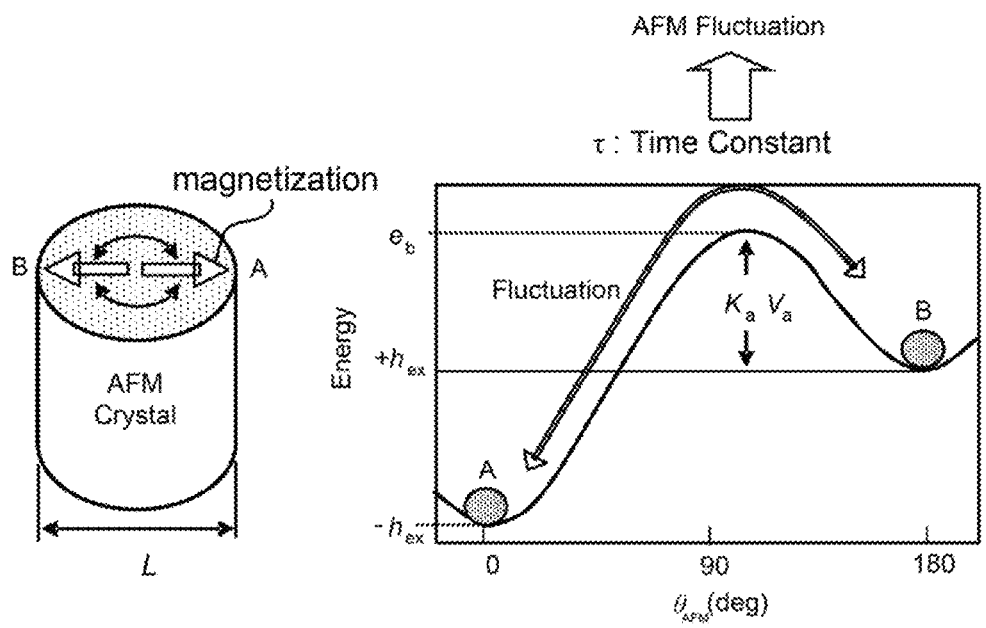
FIG. 3B shows an exemplary antiferromagnetic (AFM) crystal and a graph of an energy barrier for magnetization switching.

FIGS. 3A-3B illustrate how fluctuation in magnetization of antiferromagnetic crystal grains causes RTN. Because magnetic interaction between antiferromagnetic crystal grains is weak, magnetization of each crystal grain behaves independently in each grain. Each crystal has magnetocrystalline anisotropy, and has a direction of lowest energy and a direction of highest energy depending on the direction of the magnetic moment.

For example, FIG. 3B schematically shows the magnetocrystalline anisotropy energy curve of a single antiferromagnetic crystal. For simplicity, the target of magnetic anisotropy is shown as uniaxial. Energy is at minimal levels near 0° and 180°, and between these minimum levels, there is an energy barrier. The magnitude of this energy barrier is expressed by the product of the magnetocrystalline anisotropy constant, $K_a$, and the crystal grain volume, $V_a$. Because the value of K, is specific to the material used, the magnitude (height or amplitude) of this energy barrier is determined by the crystal grain volume. Therefore, magnetization of small antiferromagnetic crystal grains changes easily between 0° and 180° degrees because the energy barrier is low at these directions of magnetization. However, magnetization fluctuates and is unstable. By expressing ease of change in magnetization by a time constant (relaxation time), 6, the value of ô becomes shorter as the crystal becomes smaller, and the cycle at which magnetization fluctuates consequently becomes faster.

In FIG. 3A, for magnetization of a big antiferromagnetic crystal 304, the magnetization fluctuation constant, ô, is very long, several tens of years, and fluctuation may be ignored (there is essentially no fluctuation). In a small antiferromagnetic crystal 302 (AFM microcrystal), however, the magnetization fluctuation constant, ô, is very short, causing periodic magnetic fluctuation. Exchange coupling between the AFM layer 104 and the pinned layer 112 causes magnetic fluctuation in AFM microcrystals 302 to propagate to the pinned layer 112.

Because the crystal grains 306 in the pinned layer 112 are firmly bonded to each other, the magnetization of the pinned layer 112 mostly fluctuates as a unit, i.e., the direction of the magnetization of each crystal in the pinned layer 112 fluctuates together. When the magnetization of the pinned layer 112 fluctuates, the resistance of the sensor film varies. This variation is random telegraph noise. As will be described next, the smaller the size of the sensor, the greater the proportion of AFM microcrystals undergoing thermal fluctuation, which increases the RTN.

Figure 4:
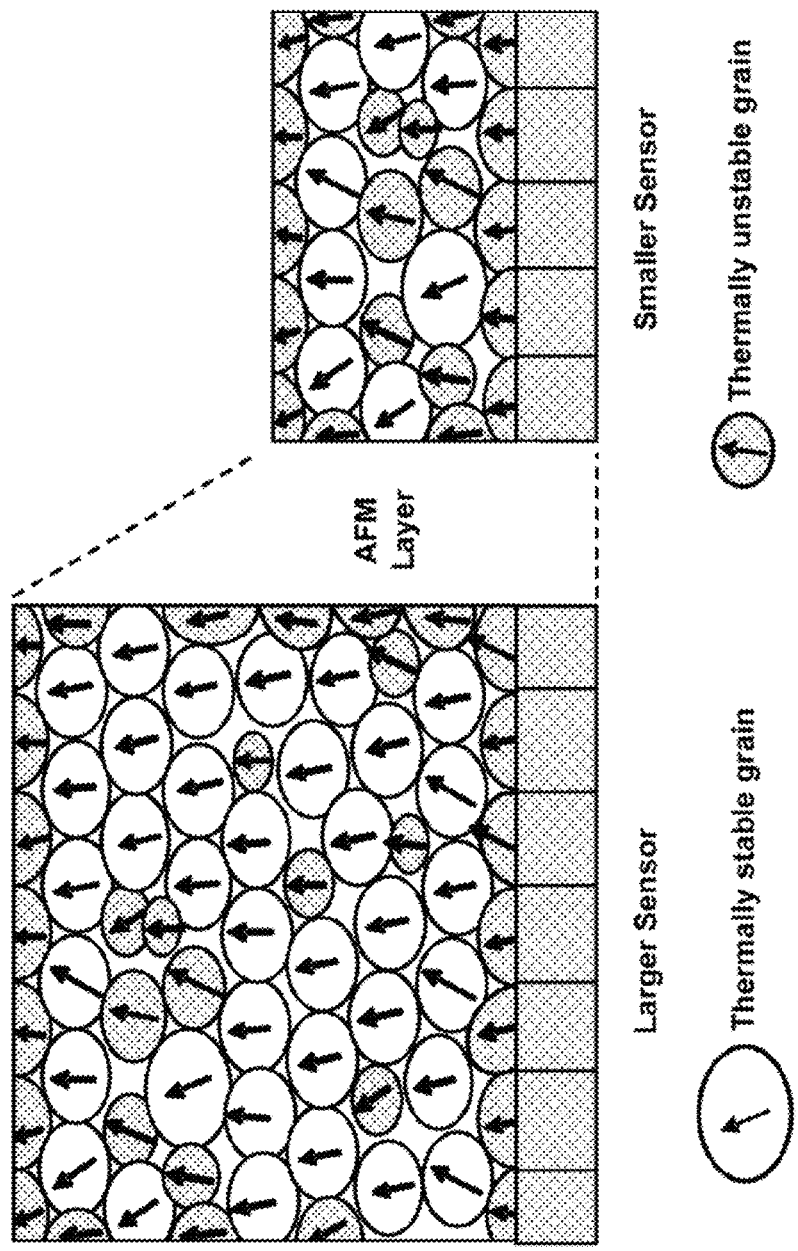
FIG. 4 schematically shows a relationship between the size of a sensor and the stability of magnetization of AFM crystal grains within the AFM layer.

FIG. 4 schematically shows a relationship between the size of a sensor (smaller sensor versus larger sensor) and the stability of magnetization of AFM crystal grains within the AFM layer. For larger and smaller sensors, AFM crystal grains in which magnetization essentially does not fluctuate are shown as white grains, and AFM crystal grains in which magnetization fluctuates frequently are shown as shaded grains. When a sensor is larger, the stable AFM crystal grains account for a majority of the volume of crystal grains. However, when a sensor is smaller, the proportion of stable crystal grains to unstable crystal grains are about equal or more approximately approach equal, as opposed to being a majority of stable AFM crystal grains. The reason that small or micro-crystal grains are more numerous at the edges of a sensor is that the crystals on the edges are cut when the sensor film is cut. Therefore, the proportion of unstable AFM crystal grains increases with a smaller sensor size. Hence, RTN increases with a smaller sensor size.

Accordingly, it would be beneficial, in order to suppress RTN associated with a smaller sensor size, to determine how to develop the smaller sensor size without the proportion of small crystal grains to large crystal grains increasing.

An external factor which causes fluctuation in the magnetization of AFM crystals is heat. The underlying cause of RTN is thermal fluctuation of fine, small, or micro-AFM crystal grains. Therefore, to suppress RTN associated with a smaller sensor size, a sensor has been designed so as not to produce fine AFM crystals on the edges of the sensor, to an extent possible. This has been accomplished, according to one embodiment, by enlarging the crystal grains of the AFM layer before processing the sensor (using heat, cutting, etc.).

In one embodiment, an AFM layer comprising MnIr in an $L_{12}$ Mn$_3$Ir ordered alloy phase (hereafter indicated as simply $L_{12}$ MnIr) is formed above or directly on a Ru layer oriented on the closed packed plane (001) of an hexagonal closed packed (hcp) crystal structure. Because of the structural similarity to the closed packed plane (111) of an fcc crystal structure, the Ru layer is easily grown by coherent growth on the 3d transition metal (111) plane of an fcc crystal structure.

Figure 5:
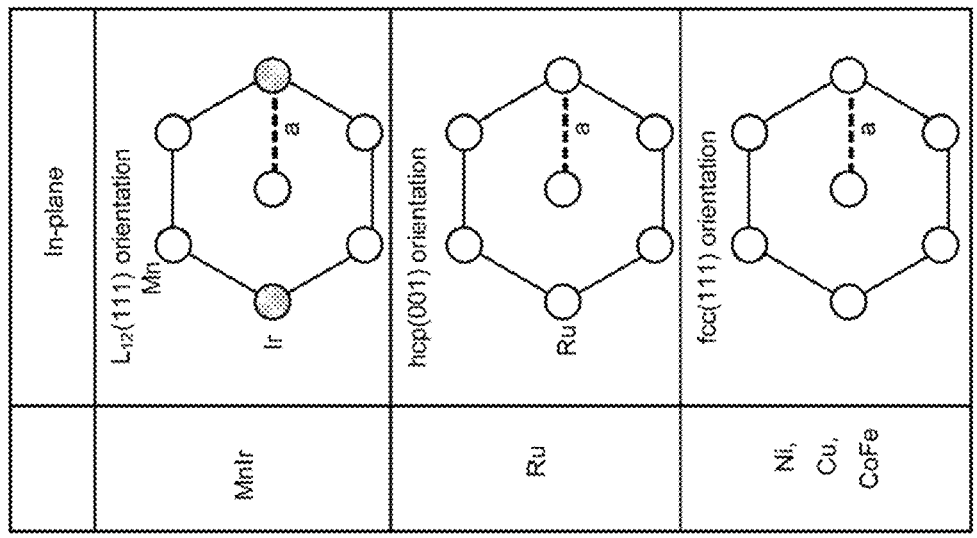
FIG. 5 shows atomic arrangements of various crystal structures.

FIG. 5 shows an atomic arrangement of an fcc 3d transition metal (I 11) plane in the lower pane, an atomic arrangement of the hcp Ru (001) plane in the center pane, and an atomic arrangement of an $L_1$ MnIr (111) plane in the top pane. For the $L_{12}$ MnIr (111) atomic arrangement, the shaded atoms represent Ir, while the white atoms represent Mn. These atomic arrangements are identical structures in which atoms are arranged at the apices and the center of a hexagon. The only difference is the nearest interatomic distance a. The nearest interatomic distance, a, of a bulk solid is highest for Ru, followed by $L_{12}$ MnIr, and lowest for the 3d transition metal of the fcc crystal structure.

Therefore, according to one embodiment, Ru may be laminated on the 3d transition metal layer of the fcc crystal structure, which has a lower nearest interatomic distance, a, than Ru. Attempting coherent growth of Ru on a 3d transition metal with a low interatomic distance, a, causes crystal strain. Specifically, the nearest interatomic distance, a (Ru), in the Ru lamination plane (001) is lessened, and the interatomic distance perpendicular to (001) lengthens. Because the nearest interatomic distance, a (Ru), in the Ru lamination plane (001) is lessened, the lattice mismatch with the nearest interatomic distance, a (MnIr), in the MnIr layer laminated over this layer is lessened. As a result, the $L_{12}$ MnIr crystal may grow by coherent growth without straining the lattice on the Ru layer. This may promote $L_{12}$ MnIr crystal growth to give a large crystal grain diameter.

As the 3d transition metal layer of the fcc crystal structure becomes thicker, the 3d transition metal layer crystal grows to become a large crystal, which may give large crystal Ru and $L_{12}$ MnIr layers on a large 3d transition metal crystal.

The combination of the 3d transition metal layer and the underlayer below is suitably selected to promote crystal growth of the 3d transition metal layer. In one approach, when the underlayer is Ta, either Ni or a NiFe alloy may be selected for the 3d transition metal layer. Ni or a NiFe alloy encourages crystal growth in the Ta layer oriented to the fcc (111) plane, and may give a large crystal. Crystal growth of Ru is also encouraged, for example, on a cobalt amorphous underlayer, such a CoHf alloy. Crystal growth of Co or a CoFe alloy is promoted on Ru.

Therefore, 1) Ta/Ni (or NiFe alloy), 2) Ta/Ni (or NiFe alloy)/a magnetic 3d transition metal layer having a fcc crystal structure, or 3) Co amorphous/Ru/Co or CoFe alloy may be used as an underlayer and a 3d transition metal layer, according to various embodiments.

The first option, Ta/Ni (or a NiFe alloy), has at least one advantage over the other choices. Even if the Ni (or NiFe alloy) film is as thick as about 300 Å, the surface roughness of the upper face of the Ni (or NiFe alloy) does not deteriorate. This will be described in more detail later. Because the barrier layer component in a TMR sensor film may be as thin as about 10 Å, it is very beneficial to form a flat shape with little surface roughness. Using the first option, Ta/Ni (or NiFe alloy), helps to increase the performance of a TMR sensor.

The TMR sensor of a read head is usually formed between two magnetic shields. The gap between the two magnetic shields on either side of the TMR sensor is called the read gap. The read gap determines the reading resolution of the read head. Therefore, since the read gap is wider when the 3d transition metal layer formed below the sensor is nonmagnetic, the reading resolution of the read head may be reduced. Thus, the 3d transition metal layer may function as a magnetic shield in order to operate properly. When this is to occur, the 3d transition metal layer comprises a magnetic material.

Because the magnetic 3d transition metal layer functions as a shield in this embodiment, this layer has a negative magnetostriction constant. This may provide an optimal magnetic domain structure as a magnetic shield.

RTN may be caused by thermal fluctuation (thermal agitation). To suppress thermal fluctuation of AFM magnetization, AFM grains may be provided with great magnetocrystalline anisotropy energy. To increase the magnetocrystalline anisotropy energy, the crystal grain size may be increased, among other ways of accomplishing this goal.

Figure 6:
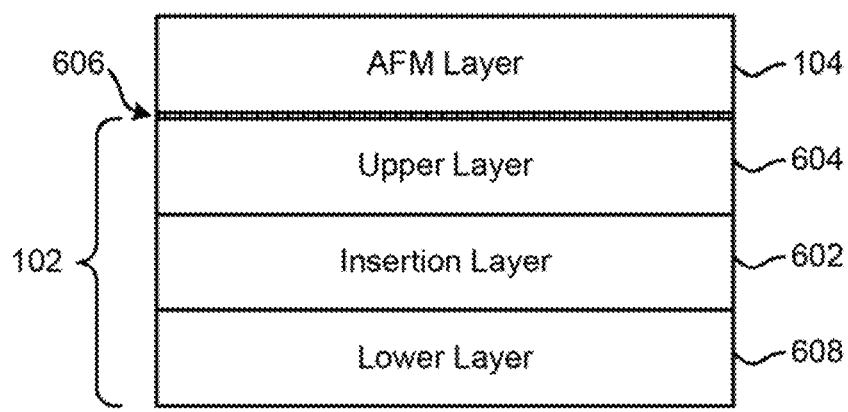
FIG. 6 shows a partial structure of a read sensor stack.

As shown in FIG. 6, which shows a simplified read sensor stack, MnIr having an ordered alloy $L_{12}$ phase with a large magnetocrystalline anisotropy constant may be used for the AFM layer 104. The AFM layer 104 may be formed above or directly on a seed layer 102. An upper layer 604 of the seed layer 102 may comprise Ru, and in some embodiments may be substantially pure Ru (greater than about 99% Ru). The lattice mismatch 606 between the Ru in the upper layer 604 of the seed layer 102 and the MnIr in the AFM layer 104 is lessened to promote crystal growth of MnIr. Because Ru has a somewhat higher nearest interatomic distance, a, in bulk state than MnIr, MnIr on Ru undergoes coherent growth while causing strain. For this reason, $L_{12}$ MnIr does not grow in a relaxed state, which prevents larger crystal growth of grains of $L_{12}$ MnIr.

Therefore, in one embodiment, an insertion layer 602 may be positioned below the upper layer 604. In one embodiment, the insertion layer 602 may comprise a 3d transition metal having a lower lattice constant than Ru. This insertion layer 602 may be grown underneath the upper layer 604 and above a lower layer 608. This insertion layer 602 may comprise Ni, Ni/Cu, Ni/Co10Fe, or any other suitable NiFe alloy. This lessens the nearest interatomic distance of the Ru crystal plane in the upper layer 604 of the seed layer 102, and lessens the mismatch between the Ru in the upper layer 604 of the seed layer 102 and the $L_{12}$ MnIr in the AFM layer 104. As a result, an MnIr crystal may grow without strain, and may become a large crystal grain, which is desired. In fact, the interatomic distance, a, of Ru is less than that of MnIr, while the interatomic distance, a, of MnIr is less than that of any of Ni, Cu, and/or CoFe.

The insertion layer 602 formed under the upper layer 604 may be formed to a thickness of about 300 Å. As a result, the crystal grain of the insertion layer 602 grows large. Large Ru and MnIr crystal grains in the upper layer 604 and AFM layer 104 are grown on an insertion layer 602 comprising a 3d transition metal having a large crystal grain, in one embodiment.

In one approach, the lower layer 608 of the seed layer 102 may comprise Ta having a thickness of between about 10 Å and about 20 Å, such as about 15 Å.

Figure 7B:
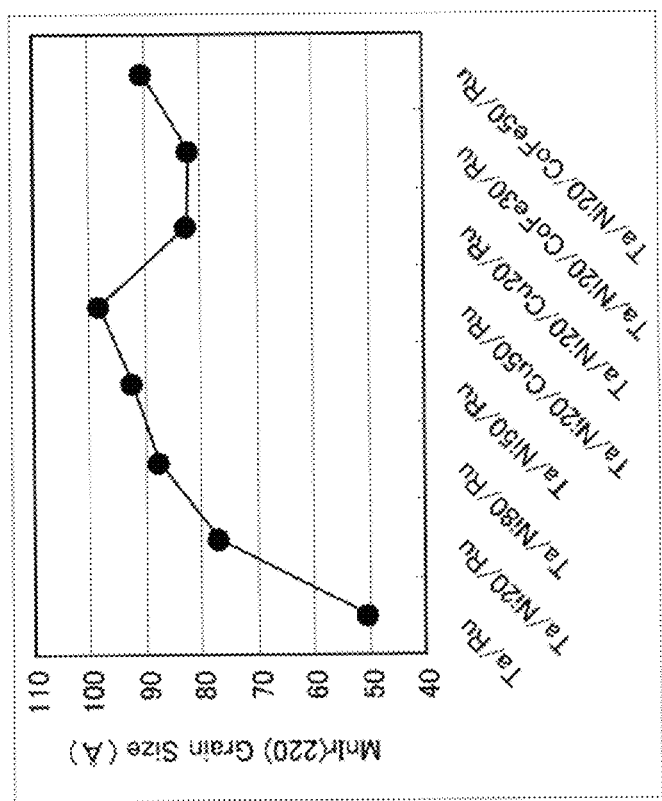
FIG. 7B shows MnIr grain size for various exemplary structures.
Figure 7A:
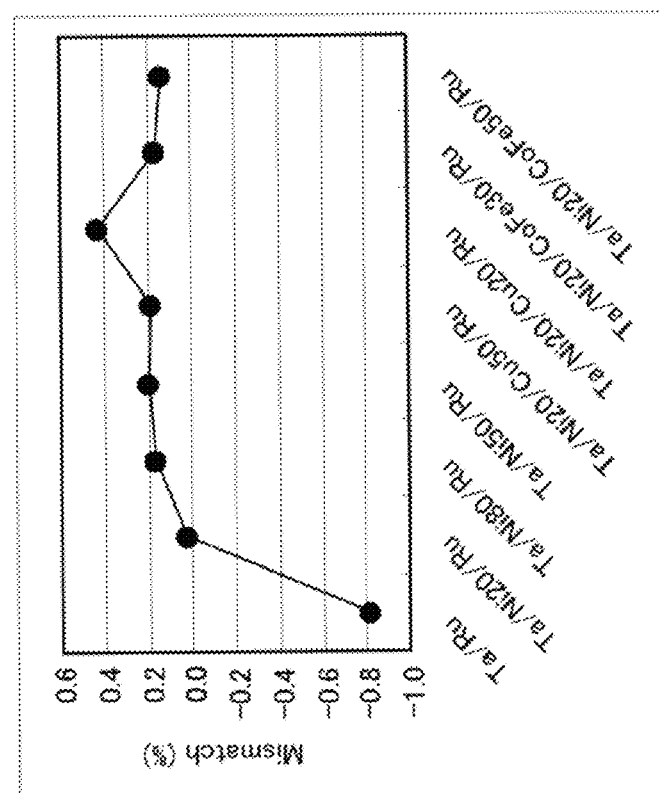
FIG. 7A shows Ru—MnIr lattice mismatch for various exemplary structures.

FIG. 7A shows Ru—MnIr lattice mismatch and FIG. 7B shows MnIr grain size, both using various underlayers. As can be seen in FIG. 7A, Ta/Ni20/CoFe30/Ru and Ta/Ru produced the most lattice mismatch, while Ta/Ni80/Ru, Ta/Ni50/Ru, Ta/Ni20/Cu50/Ru, Ta/Ni20/CoFe30/Ru, and Ta/Ni20/CoFe50/Ru produced the smallest. Accordingly, Ni, Ni/Cu, and Ni/CoFe insertion makes for a smaller lattice mismatch, which creates a larger MnIr grain size.

With reference to FIG. 7B, it can be seen that Ta/Ru provides for the smallest MnIr grain size, while any of the Ni, Ni/Cu, and Ni/CoFe insertions provide for larger MnIr grain sizes, with Ta/Ni20/Cu50/Ru provided for the largest grain size.

To produce a large exchange-coupling force between the AFM layer and the pinned layer, the MnIr crystal should be oriented on the (111) plane. To realize this, the 3d transition metal layer is oriented on the (111) plane. For example, when the first option of Ni (or NiFe alloy) is formed on a Ta layer, the Ni (or NiFe alloy) layer is oriented on the (I 1) plane. Using the second option of Ta/Ni or a NiFe alloy/a magnetic 3d transition metal layer having a fcc crystal structure, or the third option of a Co amorphous/Ru/Co (or CoFe alloy) is also effective to produce this orientation on the (111) plane. Of these, even if a thick Ni or NiFe alloy layer is formed using the structure from the first option, the surface roughness of the upper face does not deteriorate, and there is no deterioration in the TMR performance of the sensor film that is formed above this structure.

A low Fe component of the NiFe in the structure of the first option grows a larger crystal grain. Using pure Ni with zero (no added) Fe component increases coercivity. Therefore, a layer comprising Fe is preferred.

Figure 8:
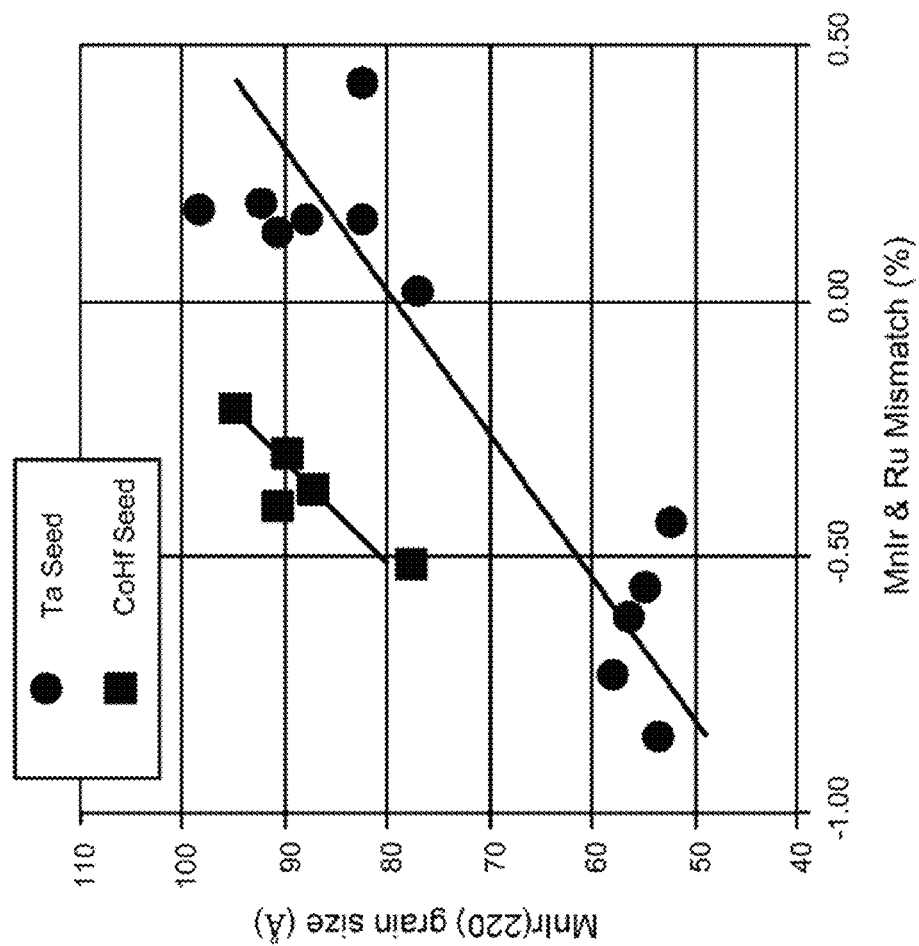
FIG. 8 shows MnIr grain size as a function of MnIr and Ru lattice mismatch for seed layers comprising Ta and CoHf.

Now referring to FIG. 8, the MnIr grain size is shown as a function of MnIr and Ru lattice mismatch for seed layers comprising Ta and CoHf. The mismatch % may be calculated based on the following equation.

As can be seen in FIG. 8, as the grain size of the MnIr increases, the MnIr and Ru mismatch % follows different sloping lines for the different seed layers, with CoHf seed layer providing different results than a Ta seed layer.

Figure 9:
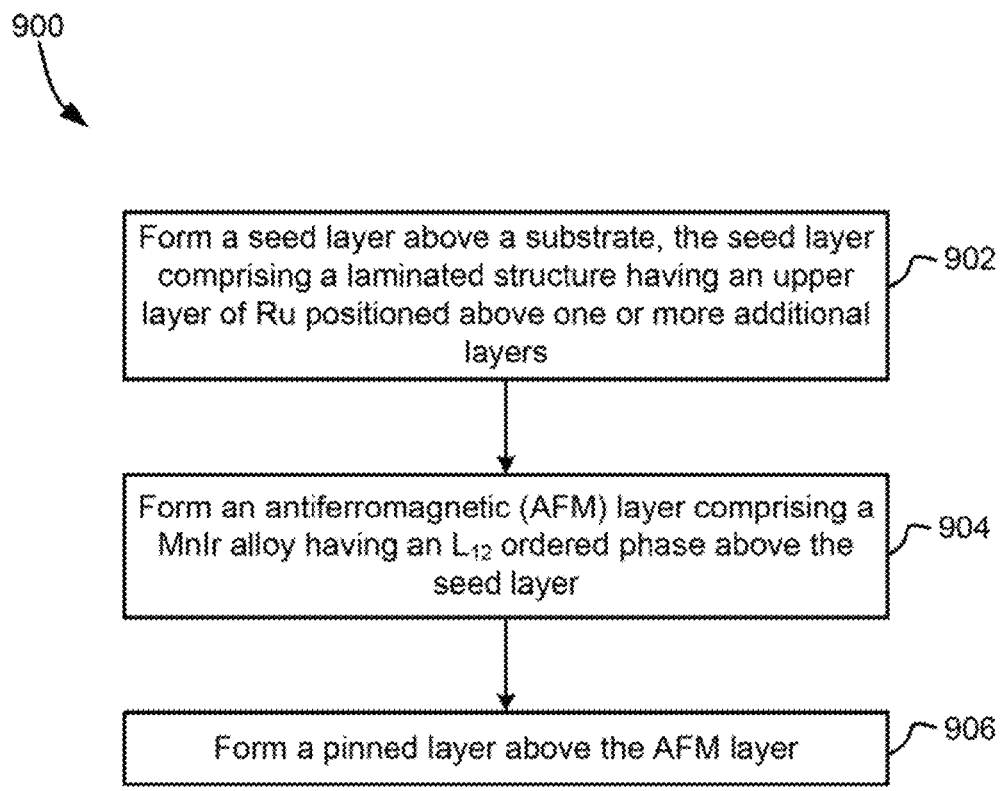
FIG. 9 is a flowchart of a method in accordance with one embodiment.

Now referring to FIG. 9, a method 900 for forming a magnetic read head is shown according to one embodiment. As an option, the present method 900 may be implemented to construct structures such as those shown in FIG. 1. Of course, however, this method 900 and others presented herein may be used to form magnetic structures for a wide variety of devices and/or purposes which may or may not be related to magnetic recording. Further, the methods presented herein may be carried out in any desired environment. It should also be noted that any aforementioned features may be used in any of the embodiments described in accordance with the various methods.

In operation 902, a seed layer is formed above a substrate, such as via sputtering, plating, vapor deposition, or any other known technique in the art. The seed layer comprises a laminated structure having an upper layer of Ru positioned above one or more additional layers.

In one embodiment, the upper layer may be substantially pure Ru, and the one or more additional layers may comprise an insertion layer positioned below the upper layer of Ru, the insertion layer comprising a 3d transition metal. Any suitable 3d transition metal may be used, such as Ni, Cu, Co, Fe, and alloys thereof, etc.

In another embodiment, the seed layer may comprise a laminated structure of Co—X amorphous alloy/Ru/Y/Ru. In this structure, X may be an element selected from a group consisting of: Hf, Ta, Zr, Nb, and W. Y may be a layer having, or being, an element selected from a group consisting of Co, Cu, Ni, Fe, and an alloy comprising at least two elements selected from a group consisting of: Co, Cu, Ni, and Fe. In a further embodiment, X may comprise greater than about 20 at % of the Co—X amorphous alloy.

In accordance with another embodiment, the seed layer may comprise a laminated structure of Ta/Y/Ru. In this structure, Y may include a material selected from a group consisting of: substantially pure Ni and a NiFe alloy having greater than 0 at % and less than 20 at % Fe In operation 904, an AFM layer comprising a MnIr alloy having an $L_{12}$ ordered phase is formed above the seed layer. Any formation technique known in the art may be used.

In operation 906, a pinned layer is formed above the AFM layer. Any formation technique known in the art may be used. In one embodiment, the pinned layer may comprise a first ferromagnetic layer (AP1) formed above the AFM layer, an exchange layer formed above the first ferromagnetic layer, and a second ferromagnetic layer (AP2) formed above the exchange layer. The exchange layer may comprise substantially pure Ru, the AFM layer may be strongly magnetically coupled by exchange coupling with the first ferromagnetic layer, and the second ferromagnetic layer may be strongly antiparallel coupled by the exchange layer.

In addition, the method 900 may further comprise forming a barrier layer above the pinned layer and forming a ferromagnetic free layer above the barrier layer, the ferromagnetic free layer being adapted to respond to an external magnetic field, a magnetic moment of the pinned layer being strongly pinned by the AFM layer. In one further approach, the barrier layer may include MgO or some other suitable material.

Figure 10:
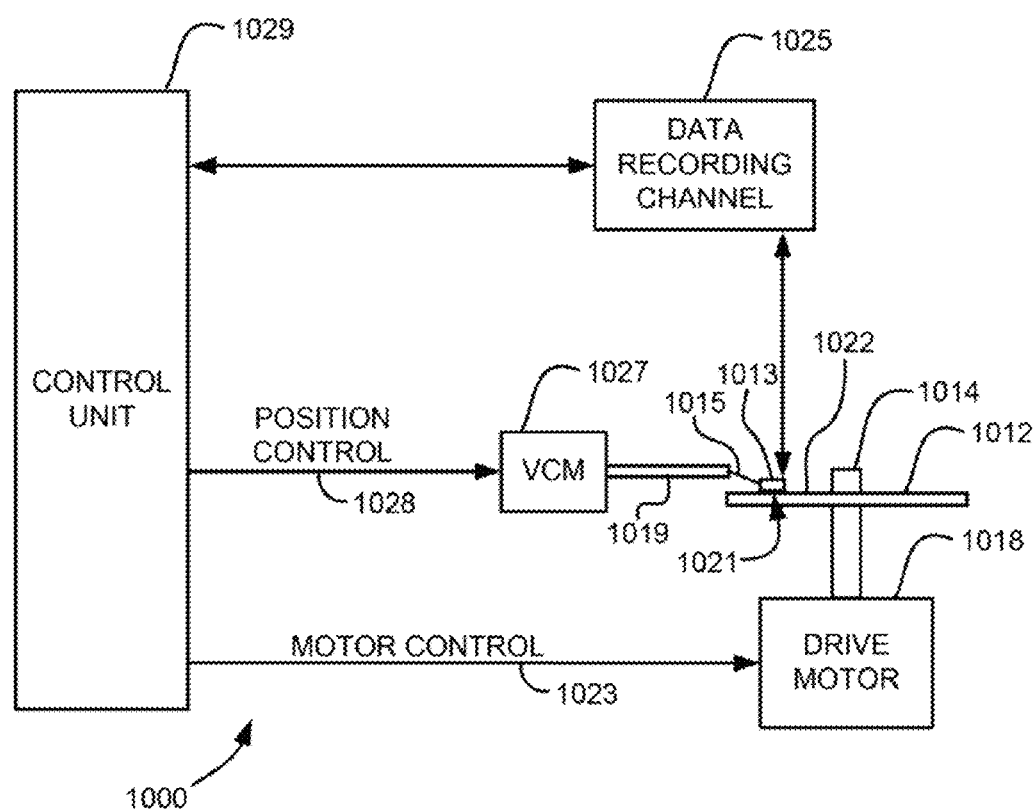
FIG. 10 is a simplified drawing of a magnetic recording disk drive system.

Referring now to FIG. 10, there is shown a magnetic data storage system, e.g., a disk drive 1000, in accordance with one embodiment of the present invention. As shown in FIG. 10, at least one magnetic storage medium, e.g., a rotatable magnetic disk 1012, is supported on a spindle 1014 and rotated by a drive mechanism, which may include a disk drive motor 1018. The magnetic recording on each disk is typically in the form of an annular pattern of concentric data tracks (not shown) on the disk 1012.

At least one slider 1013 is positioned near the disk 1012, each slider 1013 supporting one or more magnetic read/write heads 1021. As the disk rotates, slider 1013 is moved radially in and out over disk surface 1022 so that heads 1021 may access different tracks of the disk where desired data are recorded and/or to be written. Each slider 1013 is attached to an actuator arm 1019 by means of a suspension 1015. The suspension 1015 provides a slight spring force which biases slider 1013 against the disk surface 1022. Each actuator arm 1019 is attached to an actuator 1027. The actuator 1027 as shown in FIG. 10 may be a voice coil motor (VCM). The VCM comprises a coil movable within a fixed magnetic field, the direction and speed of the coil movements being controlled by the motor current signals supplied by controller 1029.

During operation of the disk storage system, the rotation of disk 1012 generates an air bearing between slider 1013 and disk surface 1022 which exerts an upward force or lift on the slider. The air bearing thus counter-balances the slight spring force of suspension 1015 and supports slider 1013 off and slightly above the disk surface by a small, substantially constant spacing during normal operation. Note that in some embodiments, the slider 1013 may slide along the disk surface 1022.

The various components of the disk storage system are controlled in operation by control signals generated by controller 1029, such as access control signals and internal clock signals. Typically, controller 1029 comprises logic control circuits, storage (e.g., memory), and a microprocessor. The controller 1029 generates control signals to control various system operations such as drive motor control signals on line 1023 and head position and seek control signals on line 1028. The control signals on line 1028 provide the desired current profiles to optimally move and position slider 1013 to the desired data track on disk 1012. Read and write signals are communicated to and from read/write heads 1021 by way of recording channel 1025.

The above description of a typical magnetic disk storage system, and the accompanying illustration of FIG. 10 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

Any of the magnetic structures described above may be used in the magnetic disk storage system as would be understood by one of skill in the art. For example, the system may include a magnetic storage medium, at least one magnetic read head as described according to any embodiment above for reading from the magnetic storage medium, and a control unit coupled to the magnetic read head for controlling operation of the magnetic read head.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic read head, comprising:
   an antiferromagnetic (AFM) layer comprising a MnIr alloy having an Ln ordered phase;
   a pinned layer positioned above the AFM layer; and
   a seed layer positioned directly below the AFM layer, wherein the seed layer comprises a laminated structure comprising at least three layers, with an upper layer comprising Ru being positioned above one or more additional layers.

2. The magnetic read head as recited in claim 1, wherein the one or more additional layers comprise an insertion layer positioned below the upper layer and above a lower shield, the insertion layer comprising a 3d transition metal selected from a group consisting of: Ni, Ni/Cu, Ni/Co10Fe, and alloys of NiFe.

3. The magnetic read head as recited in claim 2, wherein the upper layer is substantially pure Ru, and wherein the one or more additional layers comprise a lower layer positioned below the insertion layer, the lower layer comprising Ta.

4. The magnetic read head as recited in claim 1, wherein the one or more additional layers comprise an insertion layer positioned below the upper layer and above a lower shield, the insertion layer comprising a 3d transition metal selected from a group consisting of: Ni, Cu, Fe, and alloys thereof.

5. The magnetic read head as recited in claim 1, wherein the seed layer comprises four layers: Co—X amorphous alloy/Ru/Y/Ru, wherein X is an element selected from a group consisting of: Ta, Zr, Nb, and W, and wherein Y is a layer having a) an element selected from a group consisting of: Co, Cu, Ni, Fe, and/or b) an alloy comprising at least two elements selected from a group consisting of: Co, Cu, Ni, and Fe, wherein X comprises greater than about 20 at % of the Co—X amorphous alloy.

6. The magnetic read head as recited in claim 1, wherein the seed layer comprises three layers: Ta/Y/Ru, wherein Y is a material selected from a group consisting of: substantially pure Ni and a NiFe alloy having greater than 0 at % and less than 20 at % Fe.

7. The magnetic read head as recited in claim 1, further comprising:
a barrier layer positioned above the pinned layer, the barrier layer comprising MgO; and
a ferromagnetic free layer positioned above the barrier layer, the ferromagnetic free layer being adapted to respond to an external magnetic field,
wherein a magnetic moment of the pinned layer is pinned by the AFM layer.

8. The magnetic read head as recited in claim 1, wherein the pinned layer comprises:
a first ferromagnetic layer (AP1) positioned above the AFM layer;
an exchange layer positioned above the first ferromagnetic layer; and
a second ferromagnetic layer (AP2) positioned above the exchange layer,
wherein the exchange layer comprises substantially pure Ru,
wherein the AFM layer is magnetically coupled by exchange coupling with the first ferromagnetic layer, and
wherein the second ferromagnetic layer is antiparallel coupled by the exchange layer.

9. A system, comprising:
a magnetic storage medium;
at least one magnetic read head as recited in claim 1 for reading from the magnetic storage medium; and
a control unit coupled to the magnetic read head for controlling operation of the magnetic read head.

10. A magnetic read head, comprising:
a lower shield;
an antiferromagnetic (AFM) layer comprising a MnIr alloy having an $L_{12}$ ordered phase positioned above the lower shield;
a pinned layer positioned above the AFM layer; and
a seed layer positioned directly below the AFM layer and above the lower shield, the seed layer comprising a laminated structure comprising at least three layers, with an upper layer comprising Ru being positioned above one or more additional layers.

11. The magnetic read head as recited in claim 10, wherein the additional layers include at least a Ta layer positioned below Y, wherein Y is a layer of NiFe, wherein a Fe content in the NiFe is larger than 0 at % and is smaller than about 20 at %.

12. The magnetic read head as recited in claim 10, wherein the additional layers include at least a Ta layer positioned below Y, wherein Y comprises a laminated structure comprising an upper layer positioned above a lower layer, wherein the lower layer comprises substantially pure Ni or a NiFe alloy, and wherein the upper layer comprises substantially pure Co, substantially pure Cu, or an alloy comprising at least two elements selected from a group consisting of: Co, Fe, and Cu.

13. The magnetic read head as recited in claim 10, further comprising:
a barrier layer positioned above the pinned layer, the barrier layer comprising MgO; and
a ferromagnetic free layer positioned above the barrier layer, the ferromagnetic free layer being adapted to respond to an external magnetic field,
wherein a magnetic moment of the pinned layer is pinned by the AFM layer.

14. The magnetic read head as recited in claim 10, wherein the pinned layer comprises:
a first ferromagnetic layer (AP1) positioned above the AFM layer;
an exchange layer positioned above the first ferromagnetic layer; and
a second ferromagnetic layer (AP2) positioned above the exchange layer,
wherein the exchange layer comprises substantially pure Ru,
wherein the AFM layer is magnetically coupled by exchange coupling with the first ferromagnetic layer, and
wherein the second ferromagnetic layer is antiparallel coupled by the exchange layer.

15. A system, comprising:
a magnetic storage medium;
at least one magnetic read head as recited in claim 10 for reading from the magnetic storage medium; and
a control unit coupled to the magnetic read head for controlling operation of the magnetic read head.

16. A method for forming a magnetic read head, the method comprising:
forming a seed layer above a substrate, the seed layer comprising a laminated structure comprising at least three layers, the seed layer having an upper layer of Ru positioned above one or more additional layers;
forming an antiferromagnetic (AFM) layer comprising a MnIr alloy having an $L_{12}$ ordered phase above the seed layer; and
forming a pinned layer above the AFM layer.

17. The method as recited in claim 16, wherein the pinned layer comprises a first ferromagnetic layer (AP1) formed above the AFM layer, an exchange layer formed above the first ferromagnetic layer and a second ferromagnetic layer (AP2) formed above the exchange layer further, the method further comprising:
forming a barrier layer above the pinned layer; and
forming a ferromagnetic free layer above the barrier layer, the ferromagnetic free layer being adapted to respond to an external magnetic field, wherein a magnetic moment of the pinned layer is pinned by the AFM layer, wherein the AFM layer is magnetically coupled by exchange coupling with the first ferromagnetic layer, wherein the second ferromagnetic layer is antiparallel coupled by the exchange layer, and wherein the barrier layer comprises MgO.

18. The method as recited in claim 16, wherein the upper layer is substantially pure Ru, and wherein the one or more additional layers comprise an insertion layer positioned below the upper layer of Ru and above a lower shield, the insertion layer comprising a $3d$ transition metal selected from a group consisting of: Ni, Cu, Fe, and alloys thereof.

19. The method as recited in claim 16, wherein the seed layer comprises four layers: Co—X amorphous alloy/Ru/Y/Ru, wherein X is an element selected from a group consisting of: Ta, Zr, Nb, and W, wherein Y is an element selected from a group consisting of: Co, Cu, Ni, Fe, and an alloy comprising at least two elements selected from a group consisting of: Co, Cu, Ni, and Fe, and wherein X comprises greater than about 20 at % of the Co—X amorphous alloy.

20. The method as recited in claim 16, wherein the seed layer comprises three layers: Ta/Y/Ru, wherein Y is a material selected from a group consisting of: substantially pure Ni and a NiFe alloy having greater than 0 at % and less than 20 at % Fe.

* * * * *